(12) United States Patent
Ando et al.

(10) Patent No.: US 8,063,653 B2
(45) Date of Patent: Nov. 22, 2011

(54) TEMPERATURE CONTROL DEVICE AND TEMPERATURE CONTROL METHOD

(75) Inventors: Masakazu Ando, Tokyo (JP); Hiroyuki Takahashi, Tokyo (JP); Tsuyoshi Yamashita, Tokyo (JP); Takashi Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/575,815

(22) Filed: Oct. 8, 2009

(65) Prior Publication Data
US 2010/0066398 A1 Mar. 18, 2010

Related U.S. Application Data

(62) Division of application No. 10/568,623, filed as application No. PCT/JP2004/011843 on Aug. 18, 2004, now Pat. No. 7,619,427.

(30) Foreign Application Priority Data

Aug. 18, 2003 (JP) ................................. 2003-294615

(51) Int. Cl.
*G01R 31/02* (2006.01)
*G01R 31/00* (2006.01)
(52) U.S. Cl. .............................. 324/762.01; 324/750.03
(58) Field of Classification Search ............... 324/158.1, 324/760, 763–765
See application file for complete search history.

(56) References Cited

U.S. PATENT DOCUMENTS

| 5,473,259 | A | 12/1995 | Takeda |
| 5,568,054 | A | 10/1996 | Iino et al. |
| 6,111,421 | A | 8/2000 | Takahashi et al. |
| 6,204,679 | B1 | 3/2001 | Gray, III |
| 6,313,652 | B1 | 11/2001 | Maeng |
| 6,484,117 | B1 | 11/2002 | Wohlfarth |
| 6,549,026 | B1 * | 4/2003 | DiBattista et al. ............. 324/760 |
| 6,809,538 | B1 * | 10/2004 | Borkar .......................... 324/760 |
| 6,861,860 | B2 | 3/2005 | Maggi et al. |
| 6,886,976 | B2 * | 5/2005 | Gaasch et al. ..................... 374/5 |
| 6,956,391 | B2 * | 10/2005 | Kamitani ..................... 324/760 |
| 7,301,359 | B2 | 11/2007 | Furukawa |
| 7,397,258 | B2 * | 7/2008 | Suga et al. .................... 324/760 |
| 7,432,729 | B2 * | 10/2008 | Noel et al. .............. 324/750.05 |

FOREIGN PATENT DOCUMENTS

| JP | 6 88856 A | 3/1994 |
| JP | 6 102312 | 4/1994 |
| JP | 7 209373 | 8/1995 |
| JP | 8 211121 | 8/1996 |
| JP | 2000 88915 | 3/2000 |
| JP | 2001 141778 | 5/2001 |
| JP | 2001 272434 | 10/2001 |

* cited by examiner

*Primary Examiner* — Huy Q Phan
*Assistant Examiner* — Joshua Benitez
(74) *Attorney, Agent, or Firm* — Birch, Stewart, Kolasch & Birch, LLP

(57) ABSTRACT

Pressing an electronic device (2) to be tested to contact terminals (132a and 132b) while bringing a heater (112) having equal or close temperature change characteristics to those of the electronic device to be tested by a test pattern, transmitting a test pattern to the electronic device to be tested in this state, and controlling a power consumption of a heater so that total power of a power consumption of the electronic device to be tested by the test pattern and a power consumption of the heater becomes a constant value.

3 Claims, 5 Drawing Sheets

TEMPERATURE CONTROL DEVICE AND TEMPERATURE CONTROL METHOD

This application is a Divisional of co-pending application Ser. No. 10/568,623, filed on Feb. 16, 2006, the entire contents of which are hereby incorporated by reference and for which priority is claimed under 35 U.S.C. §120. Application Ser. No. 10/568,623 is the national phase of PCT International Application No. PCT/JP2004/011843 filed on Aug. 18, 2004 under 35 U.S.C. §371. The entire contents of each of the above-identified applications are hereby incorporated by reference. This nonprovisional application also claims priority under 35 U.S.C. §119(a) on patent application No. 2003-294615 filed in Japan on Aug. 18, 2003, the entirety of which is herein incorporated by reference.

TECHNICAL FIELD

The present invention relates to a temperature control device and a temperature control method preferably used in an electronic device testing apparatus for testing a variety of electronic devices, such as a semiconductor integrated circuit element, (hereinafter, referred to representatively as an IC chip), and particularly relates to a temperature control device and a temperature control method capable of conducting a test at an accurate targeted temperature even in the case where self-heating of the electronic device arises due to a pattern of test signal (hereinafter, referred to as a test pattern) at testing.

BACKGROUND ART

In a production procedure of a semiconductor device, a testing apparatus for conducting a test on a finally produced IC chip or other electronic device is necessary. As one kind of such testing apparatuses, there is known an electronic device testing apparatus for conducting a test on an IC chip under a normal temperature, a higher temperature condition or a lower temperature condition than the normal temperature. It is because, as characteristics of an IC chip, it is required to guarantee to operate well at a normal temperature, a high temperature and a low temperature.

In an electronic device testing apparatus of this kind, the testing environment is brought to be a constant temperature environment at a normal temperature, high temperature or low temperature, then, IC chips are conveyed to above a test head, where the IC chips are tested by being pressed against contact terminals of the test head and brought to electrically contact with them. From the test as above, the IC chips are preferably tested and classified to at least good ones and defective ones.

However, as IC chips become higher at speed and more highly integrated in recent years, self-heating value at operation tends to increase, and such a self-heating value tends to increase also during the test. For example, there are IC chips generating tens of watts of self-heating depending on the kind, so that a temperature range is remarkably wide between the case without self-heating and the case with self-heating.

Therefore, when conducting a high temperature test, for example, at 150° C. or so, heat due to self-heating generated by IC chips is added to this heat quantity and a correct test evaluation becomes difficult in spite of conducting test under a constant temperature environment.

A method of providing a sensor for detecting a temperature of IC chips immediately close to the IC chips and feeding-back an actual temperature of the IC chips detected by the sensor to a temperature applying device has been proposed (the patent article 1). However, there is a limit even though providing a temperature sensor immediately close to IC chips and heat resistance between the IC chips and the temperature sensor cannot become zero. Accordingly, a true temperature of the IC chips cannot be detected as far as using an external sensor.

Also, as a technique for maintaining an IC chip temperature which changes momentarily by self-heating to be in a test temperature range, there is a proposal of bringing a temperature control device provided with a heating function and a cooling function to contact with an IC chip (the patent article 1). However, a heat capacity of IC chips in downsizing trends and a heat capacity of the temperature control device were too far different, so that there was a problem that even the feedback control by a temperature control device cannot follow a temperature change by self-heating of IC chips.

[Patent Article 1] The U.S. Pat. No. 6,476,627

DISCLOSURE OF THE INVENTION

The present invention has as an object to provide a temperature control device a temperature control method, an electronic device testing handler, an electronic device testing apparatus and an electronic device testing method, by which tests can be conducted at an accurate targeted temperature even when self-heating of electronic devices arise due to a test pattern at testing and a temperature of the electronic devices largely changes.

(1) To attain the above object, according to a first aspect of the present invention, there is provided a temperature control device used for an electronic device testing apparatus for conducting a test on an electronic device to be tested by sending a test pattern to the electronic device to be tested and detecting a response pattern thereto, comprising:

a temperature adjusting device provided to contact with the electronic device to be tested; and a power control means for controlling power consumption of the temperature adjusting device, so that total power of a power consumption of the electronic device by the test pattern and a power consumption of the temperature adjusting device becomes a constant value.

To attain the above object, according to a second aspect of the present invention, there is provided a temperature control method for conducting a test on an electronic device to be tested by transmitting a test pattern to the electronic device to be tested and detecting a response pattern thereto, comprising the steps of:

bringing a temperature adjusting device to the electronic device to be tested; and controlling a power consumption of the temperature adjusting device, so that a total power of a power consumption of the electronic device to be tested and a power consumption of the temperature adjusting device becomes a constant value.

To attain the above object, according to a third aspect of the present invention, there is provided an electronic device testing handler, comprising:

a pusher for pressing an electronic device to be tested against a contact terminal, to which a test pattern is input; and a temperature adjusting device provided to the pusher so as to contact with the electronic device to be tested;

wherein a power consumption of the temperature adjusting device is controlled, so that total power of a power consumption of the electronic device to be tested by the test pattern and a power consumption of the temperature adjusting device becomes a constant value.

To attain the above object, according to a fourth aspect of the present invention, there is provided an electronic device testing apparatus, comprising:

a test pattern generation means for generating a predetermined test pattern;

a test pattern transmission means for transmitting a test pattern generated by the test pattern generation means to a contact terminal, against which a terminal of an electronic device to be tested is pressed;

a determination means for evaluating the electronic device to be tested based on a response pattern to the test pattern; and a power control means for controlling a power consumption of the temperature adjusting device, so that total power of a power consumption of the electronic device to be tested by the test pattern and a power consumption of a temperature adjusting device provided for contacting with the electronic device to be tested becomes a constant value.

To attain the above object, according to a fifth aspect of the present invention, there is provided an electronic device testing method for conducting a test on an electronic device to be tested by transmitting a predetermined test pattern to the electronic device to be tested via a contact terminal and detecting a response pattern thereto in a state of pressing a terminal of the electronic device to the contact terminal, comprising the steps of:

bringing a temperature adjusting device contact with the electronic device to be tested;

controlling a power consumption of the temperature adjusting device, so that total power of a power consumption of the electronic device to be tested by the test pattern and a power consumption of the temperature adjusting device becomes a constant value; and evaluating the electronic device to be tested based on a response pattern to the test pattern.

In the above inventions, the power control means comprises a power consumption pattern prediction portion for predicting a power consumption pattern in the electronic device to be tested from a test pattern transmitted to the electronic device to be tested; a power consumption canceling pattern generation portion for generating a power consumption canceling pattern for canceling a power consumption pattern in the electronic device to be tested; and a power consumption canceling pattern transmission portion for transmitting the power consumption canceling pattern to the temperature adjusting device.

Alternately, the power control means comprises a first power supply means which is one of parallel lines branched from a constant current supply means for supplying a constant current, for supplying a current to the electronic device to be tested; and a second power supply means which is the other parallel line branched from the constant current supply means, for supplying a current to the temperature adjusting device.

In the above invention, the step for controlling the power consumption comprises steps of predicting a power consumption pattern in the electronic device to be tested from a test pattern transmitted to the electronic device to be tested; generating a power consumption canceling pattern for canceling a power consumption in the electronic device to be tested; and transmitting the power consumption canceling pattern to the temperature adjusting device.

Alternately, the step for controlling the power consumption comprises the steps of supplying a current to the electronic device to be tested by branching to one of parallel lines from a constant current supply means for supplying a constant current; and supplying a current to the temperature adjusting device by branching to the other parallel line from the constant current supply means.

In the temperature control device, temperature control method, electronic device testing handler, electronic device testing apparatus and an electronic device testing method of the present invention, when conducting a test on the electronic device to be tested by transmitting a test pattern to the electronic device to be tested and detecting a response pattern thereto, a power consumption of a temperature adjusting device is controlled, so that total power of a power consumption of the electronic device to be tested by the test pattern and the power consumption of the temperature adjusting device becomes a constant value.

Namely, even when a test pattern is input, a sum of a power consumption of electronic devices to be tested and a power consumption of a temperature adjusting device is controlled to be constant, so that a balance of a heat quantity becomes zero when considering that the electronic devices to be tested and the temperature adjusting device are in one heating system. As a result, even when a temperature of the electronic devices to be tested changes by inputting a test pattern, heat by the temperature change is cancelled out by the temperature adjusting device, so that a temperature of the electronic devices to be tested can be maintained constant.

Also, by predicting a power consumption pattern of electronic devices to be tested from a test pattern transmitted to the electronic devices to be tested, generating a power consumption canceling pattern for canceling it and sending the same to the temperature adjusting device, and attaining a circuit configuration that a sum of power to be supplied to the electronic devices to be tested and power to be supplied to the temperature adjusting device always becomes constant; the temperature change can be suppressed without providing a sensor for detecting an actual temperature of the electronic devices to be tested. Particularly, since it is possible to prevent arising of a temperature error of the electronic devices to be tested due to provision of the temperature sensor and a control delay due to feedback control, the electronic devices to be tested can be managed to be kept in a narrower temperature range.

Furthermore, as a result of using a temperature adjusting device having temperature change characteristics equal to or close to temperature change characteristics by power consumption of the electronic devices to be tested, a correlation or a common point arises between the temperature change characteristics of the two, so that an operation of generating a power consumption canceling pattern to be sent to the temperature adjusting device becomes easy. Also, by approximating the temperature change characteristics, response at the time of controlling a temperature of the temperature adjusting device improves, and application of a heat quantity is immediately performed to the electronic devices to be tested in response to a control instruction value. Accordingly, even when an abrupt temperature change arises in the electronic device to be tested, it is possible to respond to it promptly, consequently, a test and evaluation can be made under more accurate temperature environment.

(2) To attain the above object, according to a sixth aspect of the present invention, there is provided a temperature control device used in an electronic device testing apparatus for conducting a test on an electronic device to be tested by transmitting a test pattern to the electronic device to be tested and detecting a response pattern thereto, comprising:

a heater for dynamically heating the electronic device to be tested;

a cooler made by a peltiert element for cooling or heating the electronic device to be tested; and a heat sink connected thermally to the cooler, for cooling or heating a heat release surface of the cooler.

To attain the above object, according to a seventh aspect of the present invention, there is provided an electronic device testing apparatus for conducting a test on an electronic device by transmitting a test pattern to the electronic device to be tested and detecting a response pattern thereto, comprising:

a temperature control device as explained above;

a pusher for pressing an electronic device to be tested against a contact terminal, to which a test pattern is input; and a cooler made by a peltiert element provided to the pusher so as to dynamically contact with the electronic device to be tested, for cooling or heating the electronic device to be tested.

In the above invention, heating power of the heater can be controlled dynamically based on a power consumption of an electronic device to be tested by a test pattern.

Also, in the above invention, by generating a power consumption canceling pattern based on a signal from a temperature sensing element provided to the electronic device to be tested, heating power of the heater can be dynamically controlled.

Also, in the above invention, cooling or heating of the cooler can be controlled based on a signal from a temperature sensing element provided to the electronic device to be tested.

Also, in the above invention, a first control means for performing feedback control on cooling power of the cooler based on a signal from a temperature sensing element provided to the electronic device to be tested; and a second control means for performing feedforward control on heating power of the heater based on a power consumption of the electronic device to be tested by the test pattern may be provided.

In the temperature control device and the electronic device testing apparatus of the present invention, a signal from a temperature sensing element, such as a thermal diode incorporated in an electronic device to be tested, is retrieved and cooling power of the cooler is controlled based on the temperature, so that a test can be conducted based on a temperature infinitely close to the test temperature (a junction temperature of the IC device) without being affected by changes, such as heat resistance of a part contacting with the electronic device to be tested, therefore, reliability of the test result becomes remarkably high.

Furthermore, since a peltiert element is used for the cooler, the response is good comparing with a cooler using a coolant, control of the cooling power is easy and dynamic control of the coolant is unnecessary. Also, in the case of excessive cooling, it can be heated only by inverting the applying pole and it is possible to use it also as a heater.

Also, heating power by the heater for the electronic device is controlled by feedforward control by predicting a power consumption of the electronic device to be tested by the test pattern, so that total of a heating value of the electronic device and a heating value of the heater can be always maintained to be constant, therefore, control delay due to feedback control can be prevented and the electronic device can be managed to be kept in a narrower temperature range.

BEST MODE FOR CARRYING OUT THE INVENTION

Below, embodiments of the present invention will be explained based on the drawings.

First Embodiment

Figure 1:
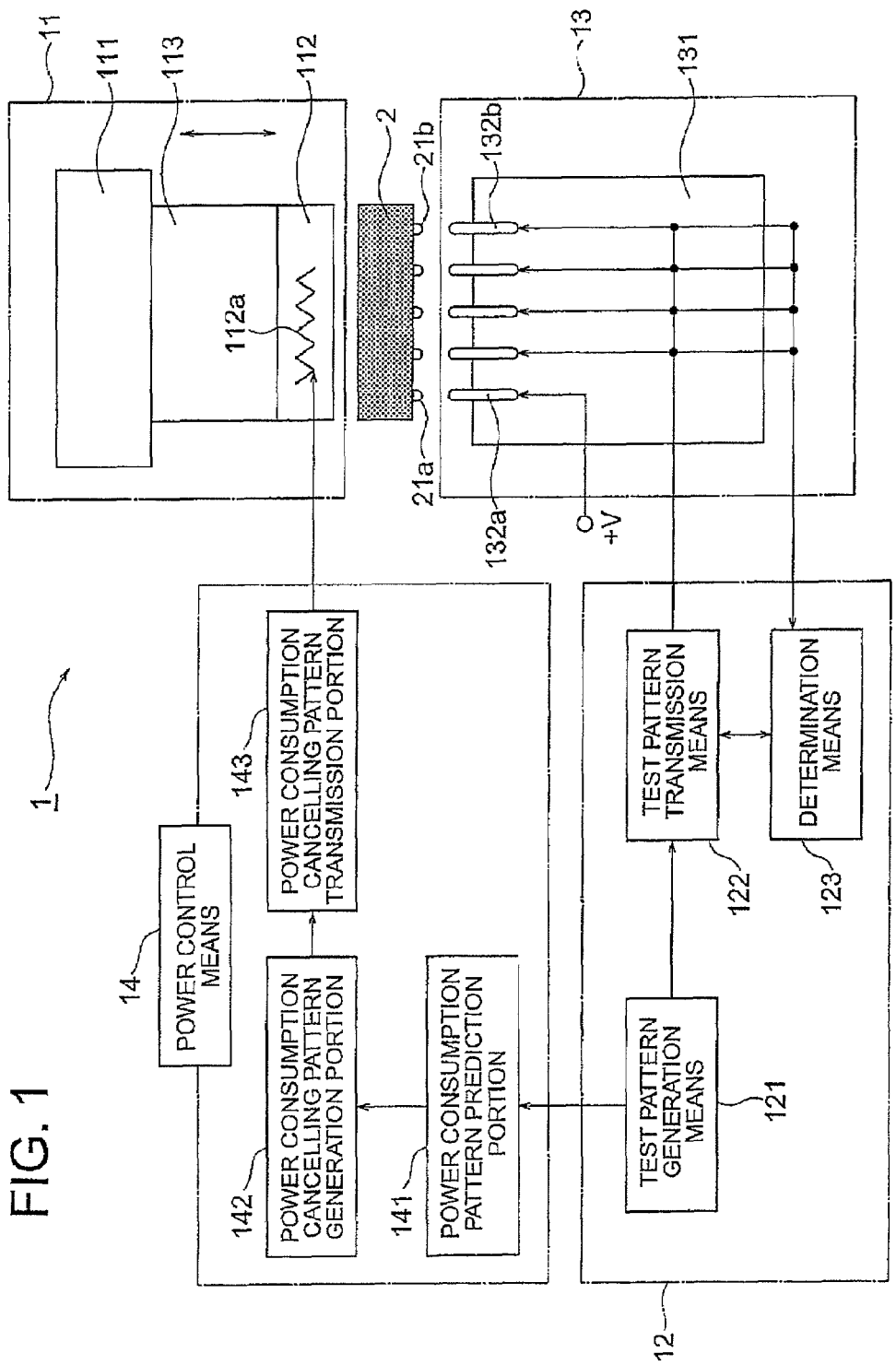
FIG. 1 is a block diagram showing an electronic device testing apparatus according to an embodiment of the present invention.

An electronic device testing apparatus 1 according to the present embodiment is an apparatus for testing whether IC chips 2 operate appropriately in a state that the IC chips 2 are imposed temperature stress of a high temperature or a low temperature or at a normal temperature without any temperature stress and classifying the IC chips 2 in accordance with the test results. The electronic device testing apparatus 1 shown in FIG. 1 comprises a handler 11 for successively conveying IC chips 2 to be tested to contact terminals 132 provided on a test head 13 and classifying the IC chips 2 finished with the test to predetermined trays in accordance with the test result, a tester 12 for sending a predetermined test pattern to test and evaluate the IC chips 2 based on a response signal thereto, and a test head 13 having contact terminals 132 and serving as an interface of the handler 11 and the tester 12. The tester 12 and the test head 13 are electrically connected and the handler 11 and the tester 12 are electrically connected via a cable or other signal line.

Note that the contact terminals 132 include contact terminals 132a for contacting with drive terminals 21a of the IC chips 2 and contact terminals 132b for contacting with input/output terminals 21b of the IC chips 2, but they are also generally called contact terminals 132. Also, the contact terminals 132 exchange a variety of signals with the tester 12 via sockets and a wiring substrate 131 provided to the test head 13.

The handler 11 is provided with a conveyor for conveying pre-test IC chips to above the contact terminals 132 of the test head 13, and the conveyor is provided with pushers 111 for picking up by suction IC chips 2 and pressing the same against the contact terminals 132. In the present invention, configurations of the conveyor and pushers 111 are not particularly limited, so that illustration of the conveyor is omitted and the pushers 111 are illustrated schematically.

Note that, as to types of the handler, a type for mounting a large number of IC chips on a test tray, conveying the same into a constant chamber installed with a test head 13 having contact terminals 132 arranged to face them and conducting a test simultaneously on the large number of IC chips, and a type for heating a plurality of IC chips in advance by using a heat plate, picking up by suction a small number of IC chips from them and conducting tests sequentially may be used in the present invention.

The pushers 111 move close to and away from the contact terminals 132 of the test head 13 in the illustrated arrowed direction by a not shown drive mechanism, and a heater 112 and a cooler 113 are provided at their ends. Note that positions of the heater 112 and the cooler 113 may be inverted.

The heater 112 according to the present embodiment is set to a heat capacity equal to or close to that of the IC chips 2. For example, when the IC chip 2 is made of an epoxy resin package having a weight of 2 g or so, the heater 112 is also formed by burying a heating element 112a in an epoxy resin package having a weight of 2 g or so. Note that the heater according to the present invention is not limited to those having a heat capacity equal to or close thereto, and it may be any as far as it has temperature change characteristics equal to or close to those of the IC chips 2 to be tested, so that the material and weight do not have to be always the same.

Note that a size of the heater 112 does not have to be always same as that of the IC chip 2 to be tested, but it is preferable to have a size capable of contacting allover the main surface of the IC chip 2 to be tested, thereby, a heat transfer effect furthermore improves.

The heater 112 according to the present embodiment takes a function of adjusting the IC chip 2 to a targeted test temperature by contacting the IC chip 2 and corresponds to the temperature adjusting device according to the present invention. Note that power to be supplied to the heating element 12a is based on a canceling pattern of a power consumption generated by a later explained power consumption canceling pattern generation portion 142 and is input via the power consumption canceling pattern transmission portion 143.

The cooler 113 according to the present embodiment can be formed by a material having a larger heat capacity comparing with those of the heater 112 and IC chip 2 and cools the heater 112, for example, by circulation of a coolant. The cooler 113 is used when the targeted test temperature is a low temperature or a normal temperature and turned off when the test temperature is a high temperature.

The heater 112 and the cooler 113 may be used as below. For example, when assuming that the targeted test temperature is −60° C. on the low temperature side, 150° C. on the high temperature side, 20° C. at the normal temperature, and temperature rising by self-heating by the IC chip 2 is 10° C. at maximum in each test temperature, when conducting a low temperature test of −60° C., the heater 112 is cooled to −70° C. by the cooler and 10° C. as the difference is adjusted by heating by the heater 112 or self-heating by the IC chip 2. In the same way, when conducting a normal temperature test at 20° C., the heater 112 is cooled to 10° C. by the cooler 113a and 10° C. as the difference is adjusted by heating by the heater 112 or self-heating by the IC chip 2.

On the other hand, when conducting a high temperature test at 150° C., the cooler 113 is turned off, a potential set temperature of the heater 112 is set at 140° C., and 10° C. as the difference is adjusted by self-heating by the IC chip 2 or the heater 112. Note that, when conducting a high temperature test, a second heater having a larger heat capacity than those of the heater 112 and the IC chip 2 is provided, the heater 112 is heated to 140° C. by the second heater, and 10° C. as the difference may be adjusted by heating by the heater 112 or self-heating by the IC chip 2.

Note that a means for conveying IC chips 2 to the contact terminals 132 of the test head 13 is not particularly limited and, for example, a means of forming vacuum suction holes on a lower surface of the heater 112 to pick up the IC chips 2 by vacuum suction and a means for loading the IC chips 2 on a test tray may be mentioned.

The tester 12 according to the present embodiment comprises a test pattern generation means 121 for generating a predetermined test pattern, and a test pattern transmission means 122 for transmitting to the contact terminals 132 a test pattern generated by the test pattern generation means 121 in a state that terminals 21 (drive terminals 21a and input/output terminals 21b are generally called terminals 21) of the IC chips 2 are pressed against the contact terminals 132.

The test pattern generation means 121 is for generating a test pattern to be supplied to the input/output terminals 21b of the IC chips 2 in a state that a constant voltage +V is applied to the drive terminals 21a of the IC chips 2, and the test pattern is suitably designed according to a test specification.

Furthermore, the tester 12 according to the present embodiment has a determination means 123 for retrieving a response pattern of the test pattern transmitted from the test pattern transmission means 122 to the input/output terminals 21b of the IC chips 2 via the contact terminals and evaluating the test of the IC chips 2 by comparing with the transmitted test pattern. The test evaluation result by the determination means 123 is transmitted to the handler 11 and post-test IC chips 2 are classified to predetermined trays.

Particularly, the tester 12 of the present embodiment is provided with a power consumption pattern prediction portion 141 for predicting a power consumption pattern of the IC chips 2 to be tested by a test pattern, a power consumption canceling pattern generation portion 142 for generating a power consumption canceling pattern for canceling the power consumption pattern, and a power consumption canceling pattern transmission portion 143 for transmitting the power consumption canceling pattern to the heater 112. The power consumption pattern prediction portion 141, the power consumption canceling pattern generation portion 142 and the power consumption canceling pattern transmission portion 143 compose the power control means 14 according to the present invention.

The power consumption pattern prediction portion 141 predicts from the test pattern power to be consumed by IC chip 2 when a test pattern generated by the test pattern generation means 121 of the tester 12 is transmitted to the IC chip 2. Namely, the circuit configuration of the IC chip 2 to be tested is known, it is possible to obtain in advance a current to flow into an internal circuit of the IC chip 2 by a logical signal input to the input/output terminals 21b of the IC chip 2. Also, the power consumption pattern to be generated here is obtained as a pattern synchronizing in terms of time with the test pattern generated by the test pattern generation means 121.

The power consumption canceling pattern generation portion 142 generates a power consumption canceling pattern for canceling the power consumption pattern obtained by the power consumption pattern prediction portion 141. The power consumption canceling pattern is generated as a pattern synchronizing in terms of time with the power consumption pattern, so that it also becomes a pattern synchronizing in terms of time with the test pattern generated by the test pattern generation means 121.

As explained above, when a test pattern is input to the IC chip 2, the IC chip 2 starts self-heating due to power consumed by the internal circuit of the IC chip 2 and causes change of the targeted test temperature. However, in the present embodiment, by inputting a pattern to cancel the power consumption as a main factor of the self-heating is input to the heating element 112a of the heater 112, a total of the power consumption in the IC chip 2 and the power consumption of the heater 112 (heating element 112a) is maintained to be constant and, thereby, temperature change of the IC chip 2 is suppressed.

Namely, when the test pattern is input to the IC chip 2, as shown in FIG. 2(A), a large and small currents (O, $i_m$, $i_{max}$, $i_{min}$) flow to the internal circuit of the IC chip 2. By flowing the large and small currents, as shown in FIG. 2(B), the IC chip 2 results in self-heating at a different heat quantity or does not result in self-heating, so that a temperature of the IC chip itself changes. Therefore, the power consumption canceling pattern generation portion 142 according to the present embodiment determines a power consumption canceling pattern, so that a total of the power consumption by the IC chip 2 and the power consumption of the heater 112 becomes always a constant value. FIG. 2(C) shows an example of a canceling pattern.

Particularly, the heater 112 according to the present embodiment is set to have a heat capacity equal to or close to that of the IC chip 2, so that a calculation formula for generating a power consumption canceling pattern from the power consumption pattern of the IC chip 2 becomes simple, and a program creating operation becomes extremely easy.

The power consumption canceling pattern generated by the power consumption canceling pattern generation portion 142 as above is transmitted to the power consumption canceling pattern transmission portion 143 and supplied as power (a current in the case of a constant voltage) from there to the heating element 112a of the heater 112. A temperature of the heater 112 by the power consumption canceling pattern changes as shown in FIG. 2D and, when it is put together with temperature change of the IC chip 2 shown in FIG. 2(B), a constant temperature as shown in FIG. 2(E) is attained.

Next, the effect will be explained.

In an example below, the case of conducting a high temperature operation test at 150° C. on an IC chip 2 according to the present embodiment will be explained. When assuming that the IC chip 2 causes self-heating of 10° C. at maximum when a test pattern is input, a temperature of the IC chip 2 rises by 10° C. at maximum comparing with a temperature $T_0$ in a state without self-heating as shown in FIG. 2(B), and the change is between $T_0$ to $T_0+10°$ C. during the test. Accordingly, a reference set temperature $T_1$ (refer to FIG. 2(D)) of the heater 112 is set at 140° C., which is lower by 10° C. than the targeted test temperature of 150° C. and the remaining 10° C. is changed in response to the test pattern to be input to the IC chip 2.

Figure 2:
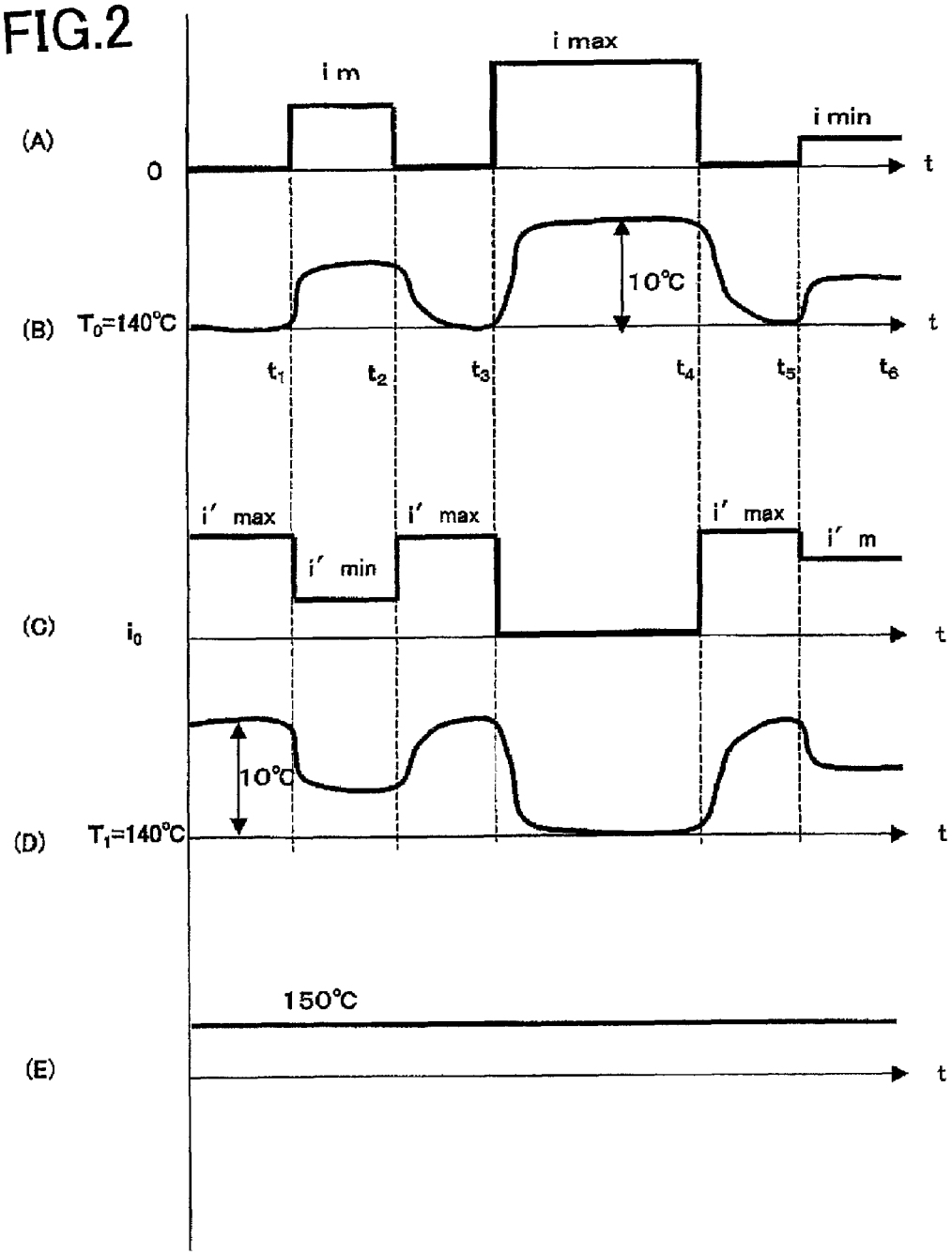
FIG. 2 shows graphs of (A) a power consumption pattern of electronic devices to be tested, (B) temperature change characteristics of electronic devices to be tested, (C) power consumption canceling pattern, (D) temperature change characteristics of a temperature adjusting device, and (E) temperature change characteristics of electronic devices to be tested when provided with the temperature adjusting device.

To furthermore specifically explain with reference to FIG. 2, the input/output terminals 21b of the IC chip 2 receives a predetermined test pattern generated by the test pattern generation means 121 in a state that a constant voltage V is applied to the drive terminals 21a and, thereby, a current shown in FIG. 2(A) flows into the internal circuit of the IC chip 2. Times 0 to $t_1$, $t_2$ to $t_3$ and $t_4$ to $t_5$ are in a test pattern suspended state, time $t_1$ to $t_2$ is a test pattern 1 ($i_m$), time $t_3$ to $t_4$ is a test pattern 2 ($i_{max}$), and time $t_5$ to $t_6$ is a test pattern 4 ($i_{min}$), respectively.

As explained above, a current of the IC chip 2 increases or decreases and a large current $i_{max}$ flows or a small current $i_{min}$ flows even when the current increases, so that a temperature of the IC chip 2 itself changes between $T_0$ to $T_0+10°$ C. as shown in FIG. 2(B) in response to the power consumption pattern. Particularly, a downsized IC chip 2 has a small heat capacity, so that the temperature sensitively changes in response to an increase and decrease of the current.

On the other hand, as a current to be supplied to the heater 112, a potential current $i_0$ is set, by which a temperature of the heater 112 becomes 140° C. being lower than the test temperature of 150° C. by 10° C., and a current based on the power consumption canceling pattern shown in FIG. 2(C) is added thereto.

Namely, as in the times 0 to $t_1$, $t_2$ to $t_3$ and $t_4$ to $t_5$ shown in FIG. 2(A), when a power consumption of the power consumption pattern is small, the IC chip 2 causes almost no self-heating, therefore, a current obtained by adding $i'_{max}$ to the potential current i0 is supplied to the heater 112 so that the temperature of the heater 112 reaches 150° C. As a result, as shown in FIG. 2(E), the IC chip 2 also becomes 150° C. as the test temperature and a test can be conducted at the targeted test temperature.

Alternately, when time t1 to t2 shown in FIG. 2(A) is the test pattern 1 (im), time t3 to t4 is the test pattern 2 (imax) and time t5 to t6 is the test pattern 3 (imin), that is, their power consumptions are not zero and the absolute values are different, currents obtained by adding currents $i'_m$ and $i'_{min}$ according to the respective power consumption are added to the potential current i0 are supplied to the heater 112, so that a temperature of the heater 112 reaches 150° C. As a result, as shown in FIG. 2(E), the IC chip 2 also becomes 150° C. as the test temperature, and the test can be conducted at the targeted test temperature.

As explained above, in the electronic device testing apparatus, the temperature control device and electronic device testing method according to the present embodiment, even when a temperature of the IC chip 2 itself changes by an input of a test pattern, heat by the temperature change is canceled by the heater 112, so that the temperature of the IC chip 2 can be maintained to be constant.

Also, a power consumption pattern to be consumed by the IC chip 2 due to the test pattern transmitted to the IC chip 2 is predicted and a power consumption canceling pattern for canceling the same is generated, the temperature change due to the self-heating can be suppressed without providing a sensor for detecting an actual temperature of the IC chip 2. Particularly, it is possible to prevent a temperature error of the IC chip 2 caused by providing a temperature sensor and a control delay by feedback control, the IC chip 2 can be managed to be kept in a narrower temperature range.

Furthermore, since a heater 112 having a heat capacity of equal to or close to a heat capacity of the IC chip 2 is brought to contact the same, an operation of generating a power consumption canceling pattern is simplified, response at the time of controlling the temperature of the heater 112 improves, and application of heat to the IC chip 2 in response to a control instruction value can be performed immediately. Accordingly, even when an abrupt temperature change arises on the IC chip 2, it can be handled immediately, consequently, a test and evaluation can be made in correct temperature environment.

Second Embodiment

Figure 3:
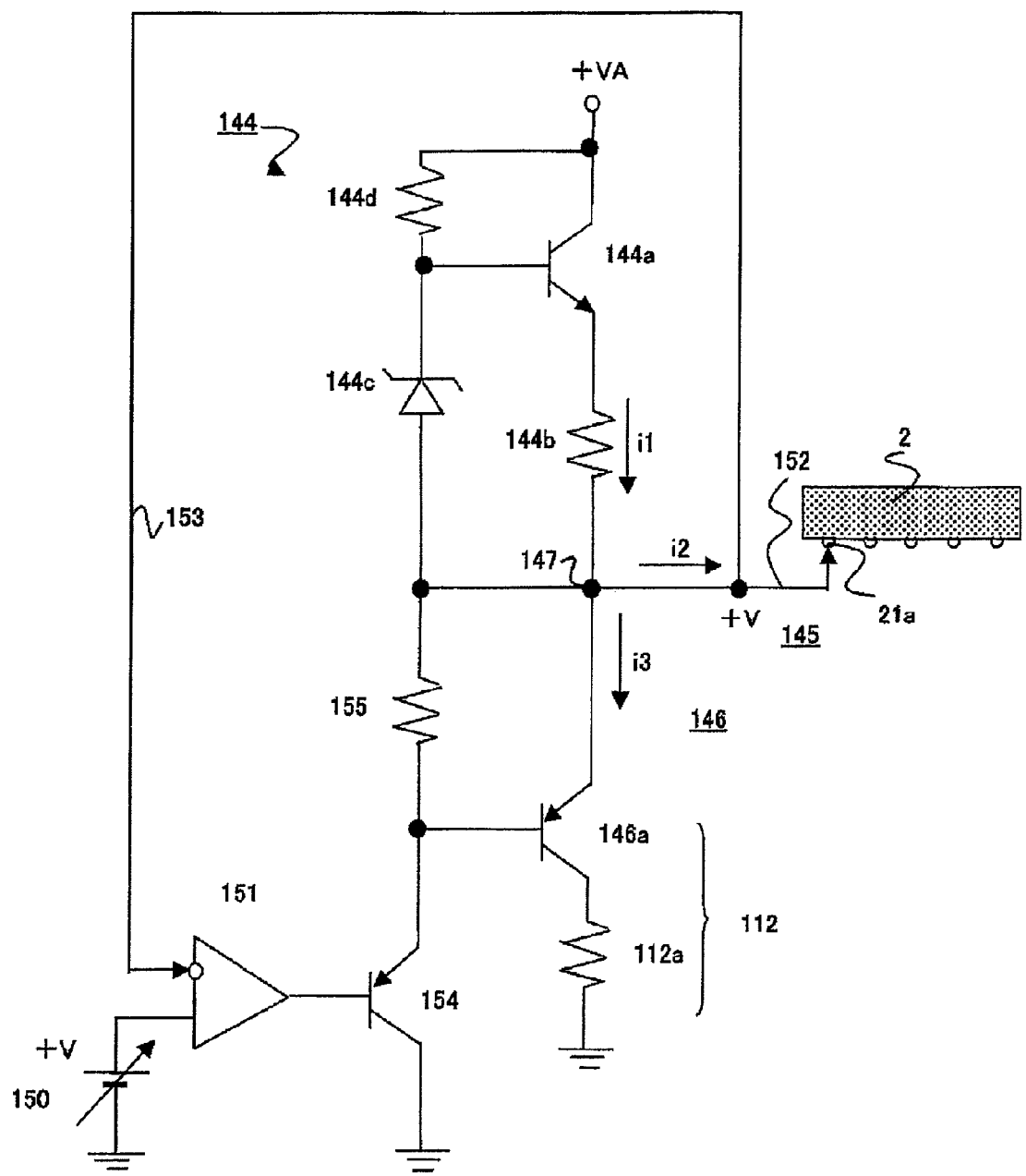
FIG. 3 is an electric circuit diagram showing a key part of a temperature control device according to another embodiment of the present invention.

FIG. 3 is an electric circuit diagram showing a key part of a temperature control device according to another embodiment of the present invention. In the above embodiment, the power control means 14 was composed of a power consumption prediction portion 141, a power consumption canceling pattern generation portion 142, and a power consumption canceling pattern transmission portion 143, while in the present embodiment, it is composed of a constant current supply circuit 144 (corresponding to the constant current supply means according to the present invention), a first power supply circuit 145 (corresponding to the first power supply means according to the present invention) and a second power supply circuit 146 (corresponding to the second power supply means according to the present invention).

As shown in FIG. 3, drive terminals 21a of the IC chip 2 is applied with a +V voltage. The application voltage of an application line 152 is connected to an input terminal of an operational amplifier 151 via a sensing line 153 and, due to an input (+V) from the variable power source 150, an output terminal of the operational amplifier 151 controls the drive terminals 21*a* via the transistor 154 and the transistor 146*a*, consequently, a constant voltage V is applied to the drive terminals 21*a* of the IC chip 2.

The constant current supply circuit 144 according to the present embodiment is configured by connecting to a power source terminal +VA a transistor 144*a* and a resistance 144*b* being in parallel with a zener diode 144*c* and a resistance 144*d*, as a result, a constant current $i_1$ flows to a line from the power source terminal +VA to a branch point 147.

The branch point 147 of the line supplied with the constant current is connected to the drive terminals 21*a* of the IC chip 2 as explained above, and being in parallel therewith, a heater 112 composed of a transistor 146*a* and a resistance 112*a* is connected. A line from the branch point 147 to the IC chip 2 composes the first power supply circuit 145 of the present embodiment, and a line from the branch point 147 to the heater 112 composes the second power supply circuit of the present embodiment. Note that the transistor 146*a* itself may be configured as the heater 112 as far as it is a transistor capable of flowing a targeted current.

In the present embodiment, when a test pattern is input to the input/output terminals 21*b* of the IC chip 2, a constant current $i_1$ is supplied from the power source terminal +VA, and a current $i_2$ flows from the branch point 147 to an internal circuit of the IC chip 2 via the drive terminals 21*a* through the line 152 (via the first power supply circuit 145), and a remaining current $i_3 = i_1 - i_2$ flows from the branch point 147 to the resistor 112*a* via the transistor 146*a*.

Accordingly, a total current value flowing to the IC chip 2 and the heater 112 becomes constant $i_1$ and, because the application voltage is constant, the total power consumption also becomes constant. As a result, total of heat quantity generated by the IC chip 2 and heat quantity generated by the heater 112 always becomes constant.

The electronic device testing apparatus, the temperature control device and an electronic device testing method according to the present embodiment configured as above can also maintain a temperature of the IC chip 2 to be constant even when a temperature of the IC chip 2 itself changes due to an input of the test pattern because the heat by the temperature change is cancelled by the heater 112.

Also, since the circuit is configured that the total power (current $i_2$) supplied to the IC chip 2 and power (current $i_3$) supplied to the heater 112 always becomes constant $i_1$, a temperature change due to self-heating can be suppressed without providing a sensor for detecting an actual temperature of the IC chip 2. Particularly, since a temperature error of the IC chip 2 due to provision of a temperature sensor and a control delay due to feedback control can be prevented, the IC chip 2 can be managed to be kept in a narrower temperature range.

Furthermore, since the total power consumption by the hardware is made to be constant comparing with the above embodiment, an operation of predicting power consumption of the IC chip 2 based on the test pattern becomes unnecessary, so that it is advantageous particularly when the test pattern is complicated and when a variety of kinds of test patterns have to be dealt with.

Third Embodiment

Figure 4:
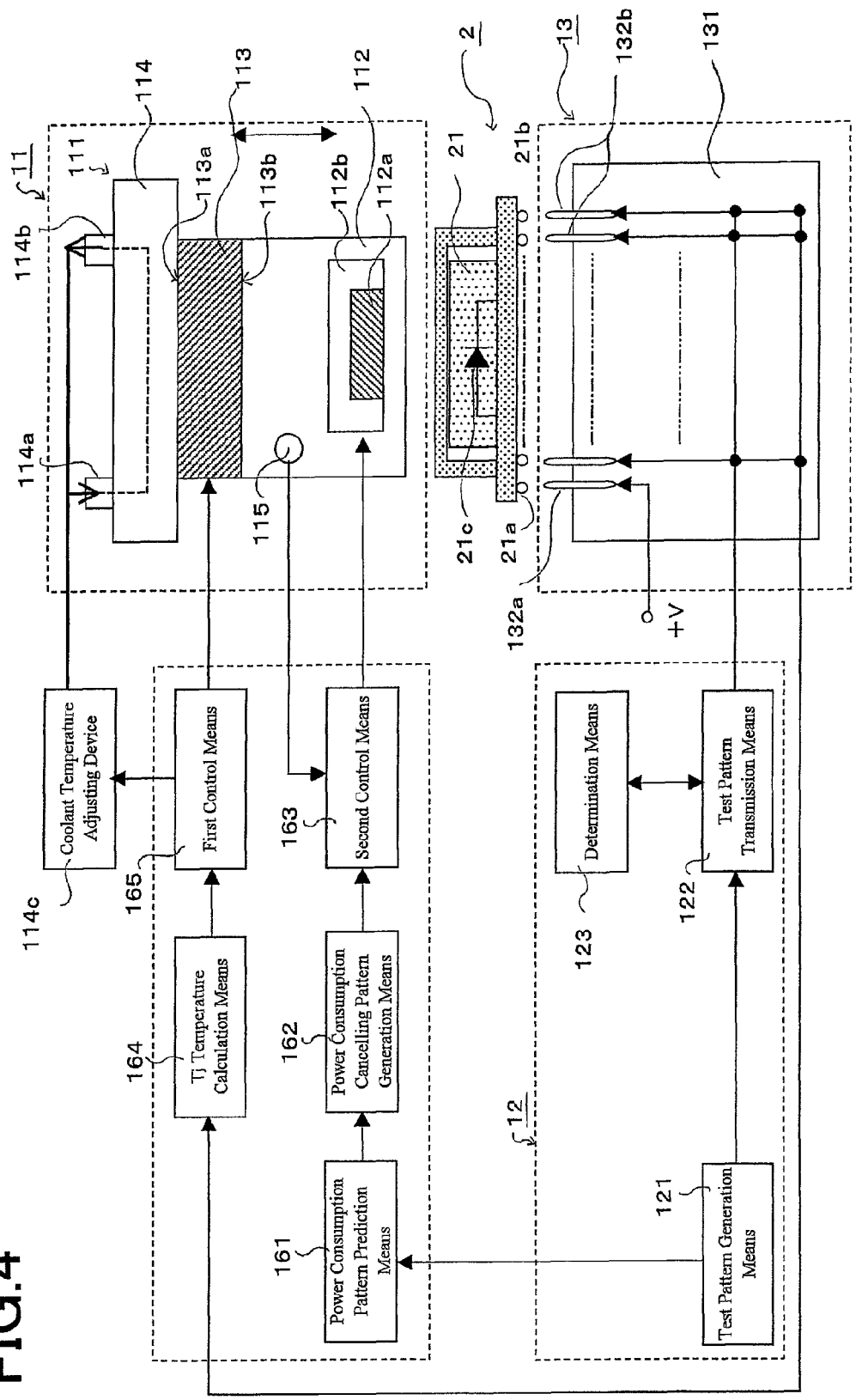
FIG. 4 is a block diagram showing an electronic device testing apparatus according to still another embodiment of the present invention.

FIG. 4 is a block diagram showing an electronic device testing apparatus 1 according to still another embodiment of the present invention. The electronic device testing apparatus 1 according to the present embodiment is, as same as that shown in FIG. 1, also an apparatus for testing whether IC chips 2 operate appropriately in a state of being imposed a high temperature or low temperature stress or at a normal temperature without any temperature stress and classifying the IC chips 2 according to the test result.

The electronic device testing apparatus 1 shown in FIG. 4 comprises a handler 11 for successively conveying IC chips 2 to be tested to contact terminals 132 provided on a test head 13 and classifying the IC chips 2 finished with test to predetermined trays in accordance with the test result, a tester 12 for sending a predetermined test pattern to test and evaluate the IC chips 2 based on the response signal, and a test head 13 having contact terminals 132 and serving as an interface of the handler 11 and the tester 12. The tester 12 and the test head 13 are electrically connected and the handler 11 and the tester 12 are electrically connected via a cable or other signal line.

Note that the contact terminals 132 include contact terminals 132*a* for contacting with drive terminals 21*a* of the IC chips 2 and contact terminals 132*b* for contacting with input/output terminals 21*b* of the IC chips 2, and they are also generally called contact terminals 132. Also, the contact terminals 132 exchange a variety of signals with the tester 12 via sockets and a wiring substrate 131 provided to the test head 13.

The handler 11 is provided with a conveyor for conveying pre-test IC chips to above the contact terminals 132 of the test head 13, and the conveyor is provided with pushers 111 for picking up by suction the IC chips 2 and pressing the same against the contact terminals 132. In the present invention, configurations of the conveyor and pushers 111 are not particularly limited, so that illustration of the conveyor is omitted and the pushers 111 are illustrated schematically.

Note that, as to types of the handler, a type for mounting a large number of IC chips on a test tray, conveying the same into a constant chamber installed with a test head 13 having contact terminals 132 arranged to face them and conducting a test simultaneously on the large number of IC chips, and a type for heating a plurality of IC chips in advance by using a heat plate, picking up by suction a small number of IC chips from them and conducting tests sequentially may be used in the present invention.

The pushers 111 move close to and away from the contact terminals 132 of the test head 13 in the illustrated arrowed direction by a not shown drive mechanism, and a heater 112 and a cooler 113 are provided at their ends. Note that positions of the heater 112 and the cooler 113 may be inverted.

Preferably, the heater 112 according to the present embodiment is set to a heat capacity equal to or close to that of the IC chips 2 and has the same or similar temperature change characteristics as those of the IC chips 2, but it is not limited to those. Also, as to heat transfer characteristics of the heating element 112*a*, it is configured not to transfer heat directly to the cooler 113 side and, preferably, it is configured to heat the IC chips 2 efficiently. For example, it can be realized, for example, by providing a low heat transfer member 112*b* having a high heat resistance to the upper portion side of the heating body 112*a* shown in FIG. 4 and by forming a hollow space. Furthermore, to enable dynamic temperature control of the IC chips 2, it is preferable to form a heating body 112*a* and low heat transfer member 112*b* having a configuration that the heat response time becomes the shortest. A path of a heat source generated by the heating body 112*a* is that the heat transfers to an immediately beneath heat transfer surface, the heat transfers in the crosswise direction while heating the IC chips 2 by contacting by the heat transfer surface, and the heat is transferred from a peripheral portion of the heater 112 to the cooler 113 side above. Due to the configuration, the IC chip 2 can be a heating configuration capable of heating rapidly.

The heater 112 according to the present embodiment takes a function of adjusting the IC chip 2 to be a targeted test temperature by contacting the IC chip 2. Note that power to be supplied to the heating element 112a is based on a canceling pattern of a power consumption generated by a later explained power consumption canceling pattern generation portion 142 and input via the power consumption canceling pattern transmission portion 143, and feedforward control is performed.

The cooler 113 according to the present embodiment is formed by a peltier element having one main surface as a heat absorbing surface 113a and the other main surface as a heat releasing surface 113b, and a current value supplied from a power source outside of the figure is controlled by a control signal from the first control means 155. Also, by switching the current flowing direction, it can be used both for cooling and heating. As a result, a temperature of a coolant flowing in the heat sink 114 does not have to be dynamically controlled. Also, there is an advantage that a set temperature of the IC chips can be realized relatively easily in a wide range of −60° C. to +150° C.

Note that the peltiert element composing the cooler 113 shown in FIG. 4 maintains a temperature of a contact surface of the heater 112 and the IC chips 2, furthermore, a junction temperature Tj of the IC chips 2 to be a desired temperature by cooling the heater 112 as a result that the lower surface becomes a heat absorbing surface 113a, while when cooled excessively, an application pole from the power source out of the figure is inverted to change the lower surface to be a heat releasing surface, so that a temperature decline of the heater 112 can be suppressed.

As to the cooler 113, feedback control is performed based on a temperature from a later explained thermal diode 21c of the IC chip 2.

The heater 112 and the cooler 113 can be used as below. For example, when assuming that the targeted test temperature is −60° C. on the low temperature side, 150° C. on the high temperature side, 20° C. at the normal temperature, and temperature rising by self-heating of the IC chip 2 is 10° C. at maximum in each test temperature; when conducting a low temperature test of −60° C., the heater 112 is cooled to −70° C. by the cooler and 10° C. as the difference is adjusted by heating by the heater 112 or self-heating by the IC chip 2. In the same way, when conducting a normal temperature test at 20° C., the heater 112 is cooled to 10° C. by the cooler 113 and 10° C. as the difference is adjusted by heating by the heater 112 or self-heating by the IC chip 2.

On the other hand, when conducting a high temperature test at 150° C., the cooler 113 is turned off, a potential set temperature of the heater 112 is set at 140° C., and 10° C. as the difference is adjusted by self-heating by the IC chip 2 or the heater 112. Note that, when conducting a high temperature test at 150° C., in the same way as in the above normal temperature test, the heater 112 is cooled to 140° C. by the cooler 113, and 10° C. as the difference may be adjusted by heating by the heater 112 or self-heating by the IC chip 2.

Note that a means for conveying IC chips 2 to the contact terminals 132 of the test head 13 is not particularly limited and, for example, a means of forming vacuum suction holes on a lower surface of the heater 112 to pick up the IC chips 2 by vacuum suction and a means for loading the IC chips 2 on a test tray may be mentioned.

The tester 12 according to the present embodiment comprises a test pattern generation means 121 for generating a predetermined test pattern, and a test pattern transmission means 122 for transmitting to the contact terminals 132 a test pattern generated by the test pattern generation means 121 in a state that terminals 21 (drive terminals 21a and input/output terminals 21b are generally called terminals 21) of the IC chips 2 are pressed against the contact terminals 132.

The test pattern generation means 121 is for generating a test pattern to be supplied to the input/output terminals 21b of the IC chips 2 in a state that a constant voltage +V is applied to the drive terminals 21a of the IC chips 2, and the test pattern is suitably designed according to a test specification.

Furthermore, the tester 12 according to the present embodiment has a determination means 123 for retrieving a response pattern of the test pattern transmitted from the test pattern transmission means 122 to the input/output terminals 21b of the IC chips 2 via the contact terminals so as to test and evaluate the IC chips 2 by comparing with the transmitted test pattern. The test evaluation result by the determination means 123 is transmitted to the handler 11 and post-test IC chips 2 are classified to predetermined trays.

Particularly, in the present embodiment, a power consumption pattern prediction means 161 for predicting a power consumption pattern of the IC chips 2 to be tested by a test pattern, a power consumption canceling pattern generation means 162 for generating a power consumption canceling pattern for canceling the power consumption pattern, and a second control means 163 for transmitting the power consumption canceling pattern to the heater 112 are provided.

The power consumption pattern prediction means 161 predicts power to be consumed by IC chip 2 when a test pattern generated by the test pattern generation means 121 of the tester 12 is transmitted to the IC chip 2 based on the test pattern. Namely, the circuit configuration of the IC chip 2 to be tested is known, it is possible to obtain in advance a current to flow into an internal circuit of the IC chip 2 by a logical signal input to the input/output terminals 21b of the IC chips 2. Also, the power consumption pattern to be generated here is obtained as a pattern synchronizing in terms of time with the test pattern generated by the test pattern generation means 121.

The power consumption canceling pattern generation means 162 generates a power consumption canceling pattern for canceling the power consumption pattern obtained by the power consumption pattern prediction means 141. The power consumption canceling pattern is generated as a pattern synchronizing in terms of time with the power consumption pattern, so that it also becomes a pattern synchronizing in terms of time with the test pattern generated by the test pattern generation means 121.

As explained above, when a test pattern is input to the IC chip 2, the IC chip 2 starts self-heating due to power consumed by the internal circuit of the IC chip 2 and causes change of the targeted test temperature. However, in the present embodiment, by inputting a pattern to cancel the power consumption as a main factor of the self-heating is input to the heating element 112a of the heater 112, the total of the power consumption in the IC chip 2 and the power consumption of the heater 112 (heating element 112a) is maintained to be constant and, thereby, temperature change of the IC chip 2 is suppressed.

This configuration is the same as that in the above explained embodiment and, when the test pattern is input to the IC chip 2, as shown in FIG. 2(A), a large and small currents (O, $i_m$, $i_{max}$, $i_{min}$) flow to the internal circuit of the IC chip 2. By flowing the large and small currents, as shown in FIG. 2(B), the IC chip 2 results in self-heating at a different heat quantity or does not cause any self-heating, so that a temperature of the IC chip itself changes. Therefore, the power consumption canceling pattern generation means 162 according to the present embodiment determines a power consumption canceling pattern, so that a total of the power consumption by the IC chip 2 and the power consumption of the heater 112 always becomes a constant value. FIG. 2(C) shows an example of a canceling pattern.

The heater 112 is set to have a heat capacity equal to or close to that of the IC chip 2 here, so that a calculation formula for generating a power consumption canceling pattern from the power consumption pattern of the IC chip 2 can be simple, and a program creating operation becomes extremely easy.

The power consumption canceling pattern generated by the power consumption canceling pattern generation means 162 as above is transmitted to the second control means 163 and supplied as power (a current in the case of a constant voltage) from there to the heating element 112a of the heater 112. A temperature of the heater 112 by the power consumption canceling pattern changes as shown in FIG. 2D and, when it is put together with temperature change of the IC chip 2 shown in FIG. 2(B), a constant temperature as shown in FIG. 2(E) is attained.

Note that the heater 112 is provided with a temperature sensor 115, an actual temperature of the heater 112 is transmitted to the second control means 163, a temperature of a part of the heater 112 is monitored whether it is at a desired temperature or not and, in accordance with need, cooling/heating capacity of the cooler 113 or cooling capacity of the coolant temperature adjusting device 114c is controlled. Note that it may be used for detecting excessive heating of the heater 112 to prevent it. Also, when an IC chip 2 not provided with a thermal diode 21c is an electronic device to be tested, a detection signal of the temperature sensor 115 is transmitted to the first control means 165 and a temperature of the cooler 113 is controlled based on the actual temperature of the heater 112.

Particularly, the electronic device testing apparatus 1 of the present embodiment uses a thermal diode 21c (corresponding to a temperature sensing element according to the present invention) incorporated in the IC chip 2 to detect an actual temperature, particularly, a junction temperature Tj (a temperature at a junction potion of the IC chip) at testing.

For example, since an element like a thermal diode is a temperature sensing element wherein a signal characteristics with respect to a temperature is determined unambiguously, when reading a response signal by the tester 12, it also retrieves an output signal from the input/output terminals 12b (including grounded terminals) electrically connected to the thermal diode and, thereby, an actual temperature of the IC chip 2 is calculated.

Therefore, an electric signal of the input/output terminals 21b corresponding to the thermal diode 21c is retrieved from the contact terminals 132 of the test head 13 to the Tj temperature calculation means 164. The Tj temperature calculation means 164 stores a calculation program for calculating an actual temperature from diode characteristics of the thermal diode 21c of the IC chip 2, and an actual temperature of the IC chip 2 obtained thereby is sent to the first control means 165.

Note that retrieval of an electric signal regarding the thermal diode 21c from the test head 13 to the Tj temperature calculation means 164 is attained by adding a retrieval command of the electric signal of the thermal diode 21c to the test program set to the tester 12, so that it can be realized without changing the hardware.

Temperature data input to the first control means 165 is infinitely close to the junction temperature of the IC chip 2, so that it is determined whether the temperature is in a temperature range as the test condition or not and, when it is out of the temperature condition, the peltiert element of the cooler 113 is adjusted (feedback control) to have an application voltage to make it within the temperature condition.

In the present embodiment, the peltiert element is used in the cooler 113, so that a heat sink 114 for discharging heat from the heat releasing surface 113b is provided. The heat sink 114 takes in a coolant, such as Flourinert (fluorine inert fluid), from an inlet 114a and discharges the same from an outlet 114b and, by circulating the same by the coolant temperature adjusting device 114c, the heat sink 114 is used as a ground portion in terms of temperature. The temperature control of the heat sink 114 is attained by feedback control based on a temperature from the thermal diode 21c sent to the first control means 165.

As explained above, in the present embodiment, first, a signal from a temperature sensing element, such as a thermal diode 21c incorporated in an IC chip 2, is retrieved and cooling power of the cooler 113 is controlled by feedback control based on the temperature, so that a test can be conducted based on a temperature infinitely close to a test temperature (a junction temperature Tj of the IC device 2) without being affected by changes of thermal resistance of a pressing and contacting part of the IC chip 2.

Also, since a peltiert element is used in the cooler 113, the response is superior to that of a cooler using a coolant, and control of the cooling power is also simple. Also, even in the case of excessive cooling, it can be heated only by inverting the application pole, so that it also serves as a heater 112. Also, since a peltiert element is used in the cooler 113, a coolant temperature of the cooling medium does not have to be dynamically controlled.

Also, as to heating power of the IC chip 2 by the heater 112, a power consumption of the IC chip 2 is predicted by a test pattern and feedforward control is performed thereon, so that the total of a heating value of the IC chip 2 and a heating value of the heater 112 can be always maintained constant and, thereby, a control delay due to feedback control can be prevented and the IC chip 2 can be managed to be kept in a narrower temperature range.

In the block diagram in FIG. 4 as explained above, the present invention was explained by taking a specific example that the first control means 165 controls the cooler 113 based on a signal of a temperature detected by the thermal diode 21c, but the heating body 112a side may be also controlled at a time. In that case, due to the heating body 112a with rapid response characteristics, more preferable temperature control becomes possible.

Also, it takes heat transfer delay time of, for example, tens of milliseconds or so for a heat source from the heating body 112a to reach inside of the IC chip 2. Therefore, during the time corresponding to the heat transfer delay time, the test pattern generation means 121 may generate a rapid power consumption canceling pattern and supply the same to the power consumption pattern prediction means 161. As a result, temperature control with furthermore preferable response characteristics becomes possible.

Figure 5:
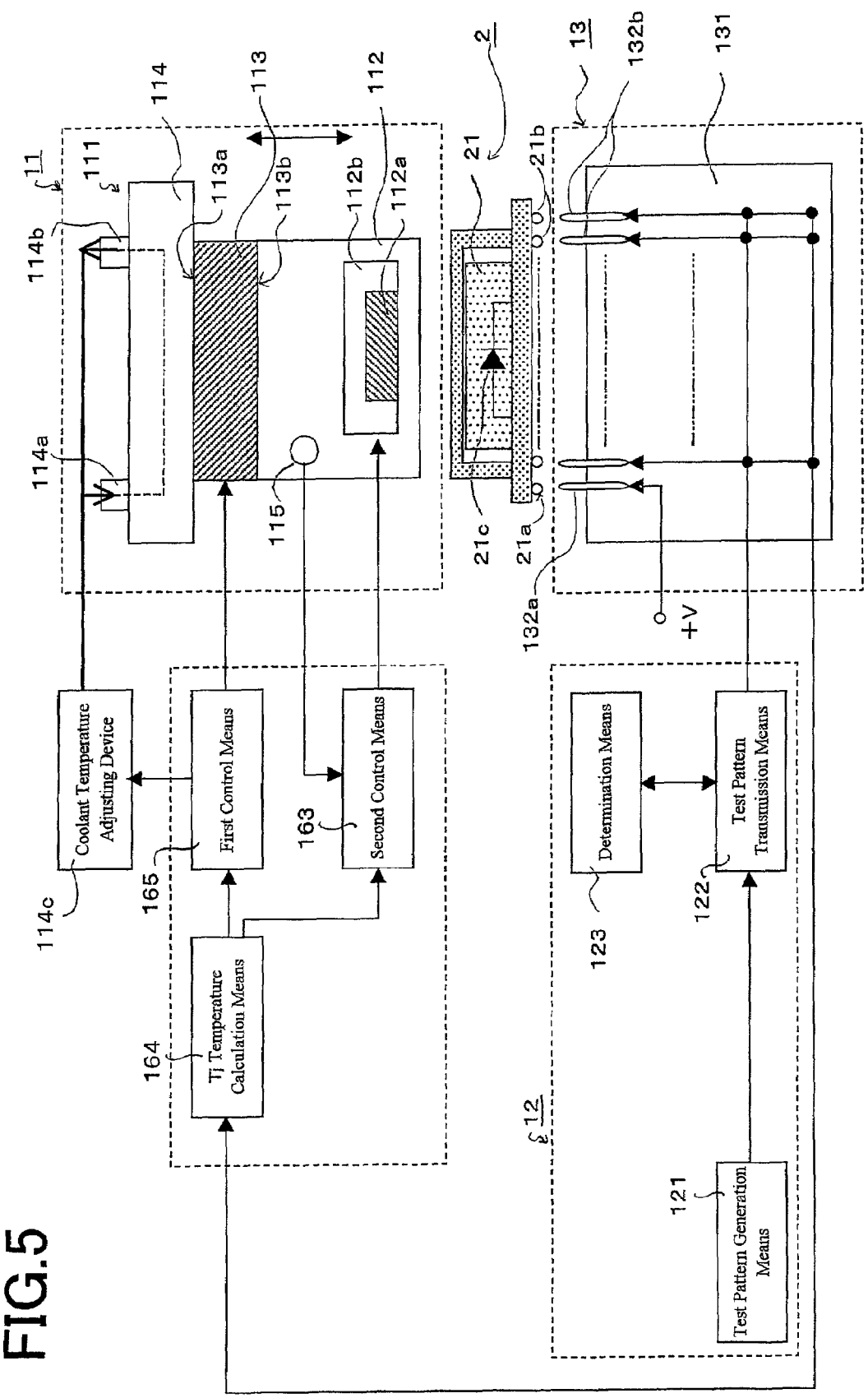
FIG. 5 is a block diagram showing an electronic device testing apparatus according to still another embodiment of the present invention.

Also, in the block diagram in FIG. 4 explained above, it is configured to be provided with a power consumption pattern prediction means 161 and a power consumption canceling pattern generation means 162, but it may be configured to omit them as shown in FIG. 5 and a junction temperature of the IC chip 2 may be detected by the thermal diode 21c and both of the cooler 113 and the heating body 112a may be controlled at a time based thereon. Preferably, roles of the two are that the cooler 113 handles canceling of gentle temperature change and the heating body 112a handles canceling of abrupt temperature change. In that case, a power consumption canceling pattern does not have to be generated.

Also, as another configuration example, means for performing differential addition or differential subtraction on a heating power energy to be supplied to the heating body 112a based on a change amount of a temperature change detected by the thermal diode 21c may be added. For example, the heating power is increased differentially when a decline of the junction temperature is detected, while the heating power is differentially decreased when a rise of the junction temperature is detected. Due to this, response characteristics of heat transfer can be corrected, so that temperature control with furthermore preferable response characteristics becomes possible.

The embodiments explained above are described to facilitate understanding of the present invention and is not to limit the present invention. Accordingly, respective elements disclosed in the above embodiments include all design modifications and equivalents belonging to the technical scope of the present invention.

The invention claimed is:

1. A temperature control device used for an electronic device testing apparatus for conducting a test on an electronic device to be tested by sending a test pattern to the electronic device to be tested and detecting a response pattern thereto, comprising:
    a temperature adjusting device provided to contact with said electronic device to be tested;
    one constant current supply circuit for supplying a constant current;
    a first power supply circuit branched from said constant current supply circuit, for supplying a current to said electronic device to be tested; and
    a second power supply circuit branched from said constant current supply circuit, for supplying a current to said temperature adjusting device,
    wherein total power of a power consumption of said electronic device by said test pattern and a power consumption of said temperature adjusting device becomes a constant value.

2. A temperature control method for conducting a test on an electronic device to be tested by transmitting a test pattern to said electronic device to be tested and detecting a response pattern thereto, comprising the steps of:
    bringing a temperature adjusting device to said electronic device to be tested;
    supplying a current by one constant current supply circuit for supplying a constant current;
    supplying a current to said electronic device to be tested by branching to one line from said constant current supply circuit; and
    supplying a current to said temperature adjusting device by branching to the other line from said constant current supply circuit,
    wherein total power of a power consumption of said electronic device by said test pattern and a power consumption of said temperature adjusting device becomes a constant value.

3. An electronic device testing apparatus, comprising:
    a test pattern generation device configured to generate a predetermined test pattern;
    a test pattern transmission device configured to transmit a test pattern generated by said test pattern generation device to a contact terminal, against which a terminal of an electronic device to be tested is pressed;
    a determination device configured to evaluate said electronic device to be tested based on a response pattern to said test pattern;
    one constant current supply circuit for supplying a constant current;
    a first power supply circuit branched from said constant current supply circuit, for supplying a current to said electronic device to be tested; and
    a second power supply circuit branched from said constant current supply circuit, for supplying a current to said temperature adjusting device,
    wherein total power of a power consumption of said electronic device by said test pattern and a power consumption of said temperature adjusting device becomes a constant value.

* * * * *